US008957691B2

(12) United States Patent
Wang et al.

(10) Patent No.: US 8,957,691 B2
(45) Date of Patent: Feb. 17, 2015

(54) PROBE CARDS FOR PROBING INTEGRATED CIRCUITS

(75) Inventors: Mill-Jer Wang, Hsin-Chu (TW);
Ching-Nen Peng, Hsin-Chu (TW);
Hung-Chih Lin, Hsin-Chu (TW); Hao Chen, Luzhou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 593 days.

(21) Appl. No.: 13/278,570

(22) Filed: Oct. 21, 2011

(65) Prior Publication Data
US 2013/0099812 A1 Apr. 25, 2013

(51) Int. Cl.
*G01R 1/067* (2006.01)
*G01R 31/28* (2006.01)
*G01R 31/319* (2006.01)
*G01R 1/073* (2006.01)

(52) U.S. Cl.
CPC ...... *G01R 31/2889* (2013.01); *G01R 31/31905* (2013.01); *G01R 1/07371* (2013.01)
USPC .................................................. 324/755.01

(58) Field of Classification Search
CPC .................... G01R 31/318511; G01R 31/2851; G01R 1/06722; G01R 31/2831; G01R 1/0675; G01R 31/303; G01R 31/311
See application file for complete search history.

(56) References Cited

U.S. PATENT DOCUMENTS

| 6,727,723 | B2 * | 4/2004 | Shimizu et al. ........ 324/750.05 |
| 7,750,651 | B2 | 7/2010 | Chao et al. |
| 8,525,539 | B2 | 9/2013 | Washio et al. |
| 2002/0011859 | A1 | 1/2002 | Smith et al. |
| 2008/0106292 | A1 | 5/2008 | Chui et al. |
| 2011/0095778 | A1 | 4/2011 | Chou et al. |
| 2014/0176165 | A1 | 6/2014 | Wang et al. |

FOREIGN PATENT DOCUMENTS

| CN | 1257209 | 6/2000 |
| CN | 101178414 | 5/2008 |
| CN | 101625375 | 1/2010 |
| TW | 201115153 | 5/2011 |
| TW | 201129814 | 9/2011 |

OTHER PUBLICATIONS

Marinissen, E.J., "Testing TSV-Based Three-Dimensional Stacked ICs," Design, Automation & Test in Europe Conference & Exhibition, Conference Publications, Mar. 8-12, 2010, pp. 1689-1694.
Marinissen, E.J., "Testing TSV-Based Three-Dimensional Stacked ICs," Design, Automation & Test in Europe Conference & Exhibition, Mar. 8-12, 2010, pp. 1689-1694, IEEE.

* cited by examiner

*Primary Examiner* — Tung X Nguyen
(74) *Attorney, Agent, or Firm* — Slater & Matsil, L.L.P.

(57) ABSTRACT

A device includes a probe card, which further includes a chip. The chip includes a semiconductor substrate, a test engine disposed in the chip, wherein the test engine comprises a device formed on the semiconductor substrate, wherein the device is selected from the group consisting essentially of a passive device, an active device, and combinations thereof. A plurality of probe contacts is formed on a surface of the chip and electrically connected to the test engine.

22 Claims, 17 Drawing Sheets

PROBE CARDS FOR PROBING INTEGRATED CIRCUITS

BACKGROUND

With the increasing downsizing of integrated circuits, more and more devices and functions are integrated into a semiconductor chip. As a result, more and more electrical connectors such as solder balls and micro-bumps need to be formed on the surface of the semiconductor chip, and the pitch of the electrical connectors becomes increasingly smaller. This posts a problem for the testing of integrated circuits. When the pitch of the electrical connectors becomes too small, probe cards may not be used since the pitch of the probe pins on the probe cards is greater than the pitch of the electrical connectors on the semiconductor chips. Even if the probe cards are used in the testing, the likelihood that the electrical connectors are damaged by probe cards is also high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Probe cards that are built based integrated circuits formed on semiconductor chips/wafers are provided in accordance with various embodiments. The methods for probing/testing devices-under-test (DUTs) using the probe cards of the embodiments are also provided. Throughout the various views and illustrative embodiments, like reference numbers are used to designate like elements.

Figure 1:
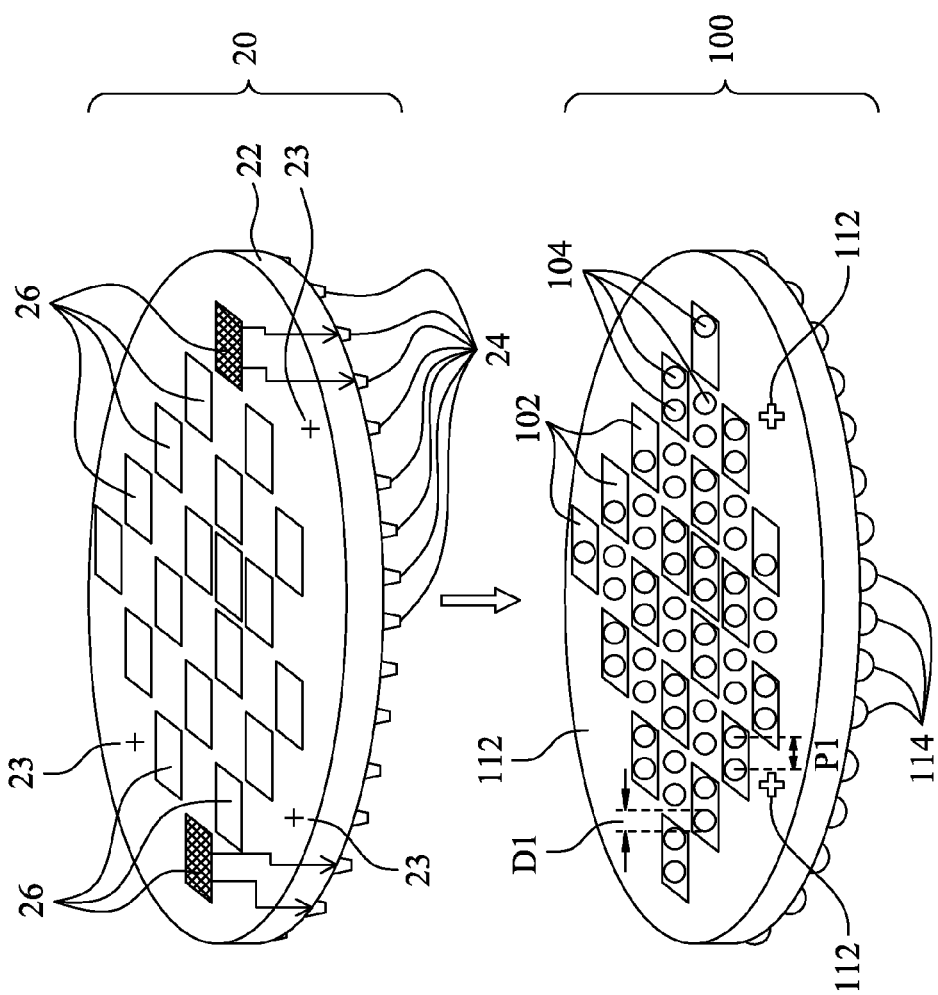
FIGS. 1 through 4 are perspective views of test wafers, device-under-test (DUT), and the respective chips therein.

FIG. 1 illustrates a perspective view of a portion of probe card 20 in accordance with embodiments, and DUT 100 that is probed using probe card 20. Probe card 20 includes semiconductor wafer 22 (a test wafer, please refer to FIG. 5), which further include probe contacts 24 on a side. Semiconductor wafer 22 may include integrated circuits formed on a semiconductor substrate 30 (not shown in FIG. 1, please refer to FIG. 5). Accordingly, probe card 20 is referred to as silicon-based probe card 20 throughout the description, although semiconductor substrate 30 may also be formed of semiconductor materials other than silicon.

Figure 4:
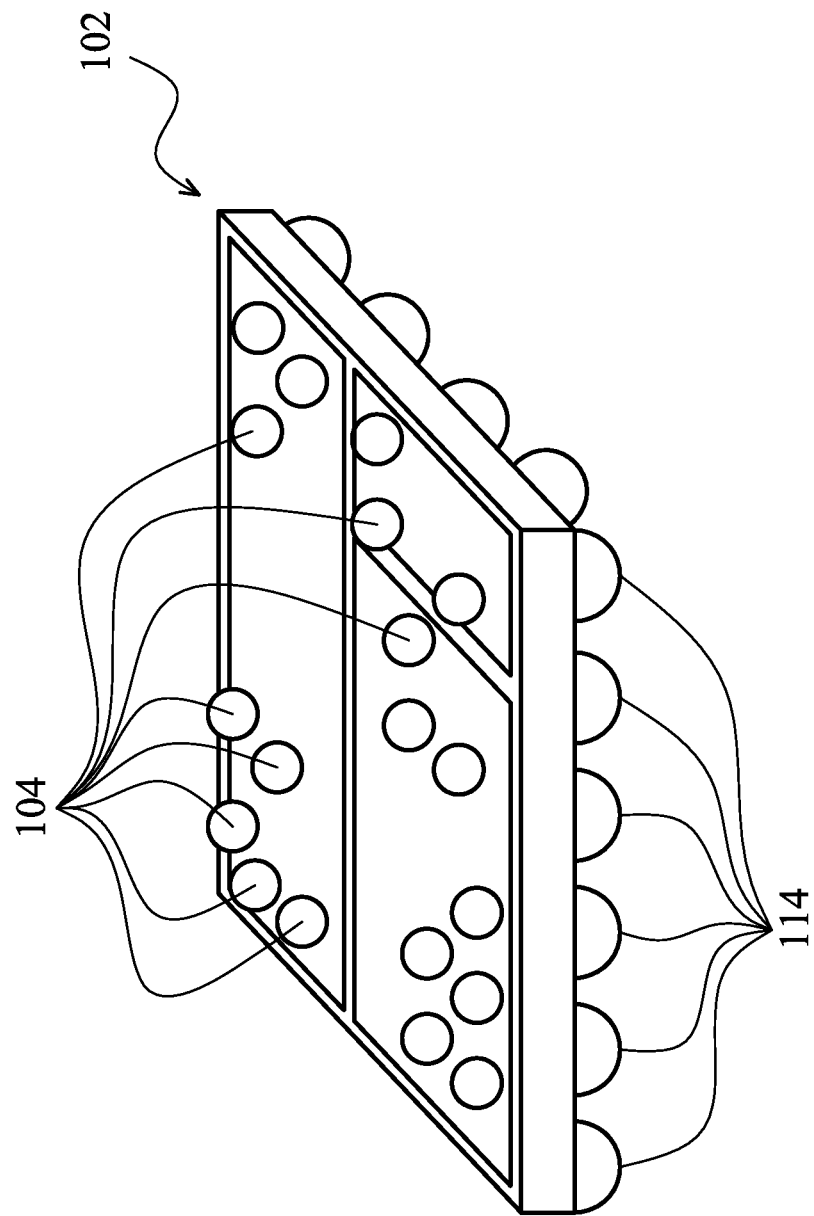

DUT 100 may be a device wafer that includes integrated circuit devices such as transistors (not shown) therein, for example, although DUT 100 may also be another type of device. DUT 100 may include a plurality of chips 102, which may be identical to each other. Alternatively, some of chips 102 may be different from other chips 102. A magnified view of one of chips 102 is shown in FIG. 4. Electrical connectors 104 are formed on the top surface of DUT 100, wherein electrical connectors 104 may be micro-bumps, solder balls, copper bumps, metal pads, or other types of applicable connectors. In some embodiments, connectors 114 may be disposed on the opposite side of DUT 100 than connectors 104. Connectors 114 may be solder bumps (also referred to as C4 bumps in the art). Electrical connectors 104 may have the minimum pitch P1 smaller than about 40 μm, for example. Furthermore, diameters D1 of connectors 104 may be smaller than about 20 μm. The probing to DUT 100 is performed through connectors 104.

Probe contacts 24 in probe card 20 have a mirrored pattern of at least some, and possibly all, of connectors 104. Accordingly, when silicon-based probe card 20 is put into contact with DUT 100, probe contacts 24 are in contact with connectors 104. The number of probe contacts 24 may be equal to the number of connectors 104. As a result, during the probing, each of probe contacts 24 is in contact with one connector 104, and each of connectors 104 is in contact with one probe contact 24. Probe contacts 24 may be in the form of micro-bumps, metal pads, under-bump-metallurgies (UBMs), or in other applicable forms. In alternative embodiments, some of connectors 104 have corresponding contacting probe contacts 24, while some other connectors 104 do not have corresponding contacting probe contacts 24. During the probing, the alignment of connectors 104 to probe contacts 24 may be performed through aligning alignment marks 23 in test wafer 22 to alignment marks 112 in DUT 100.

Figure 2:
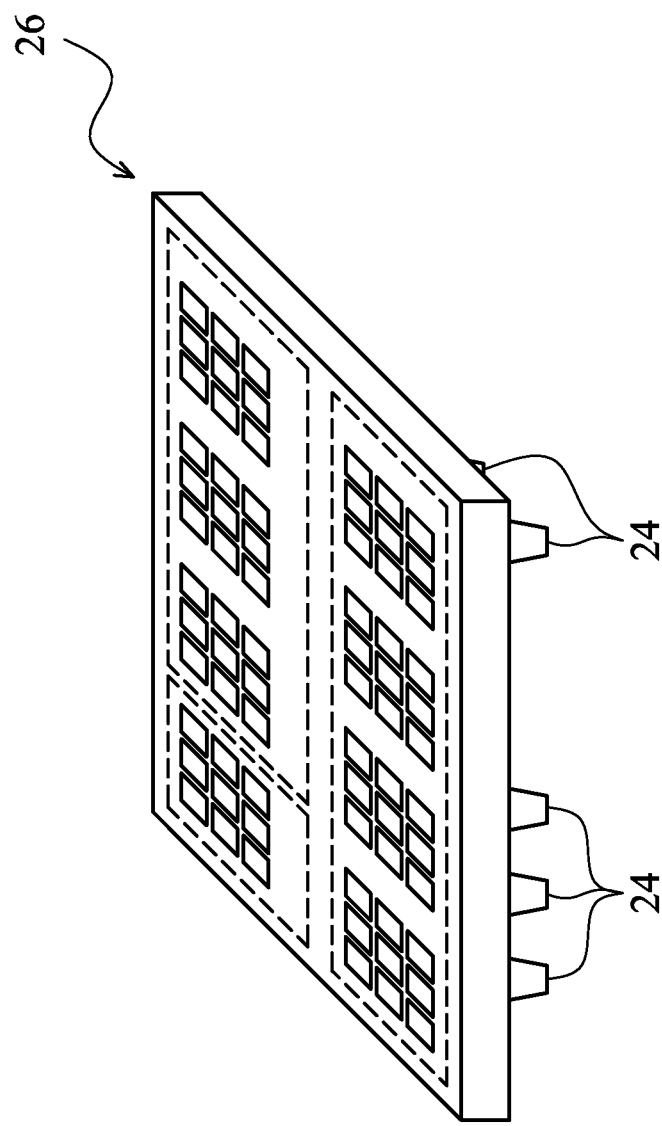
Figure 3:
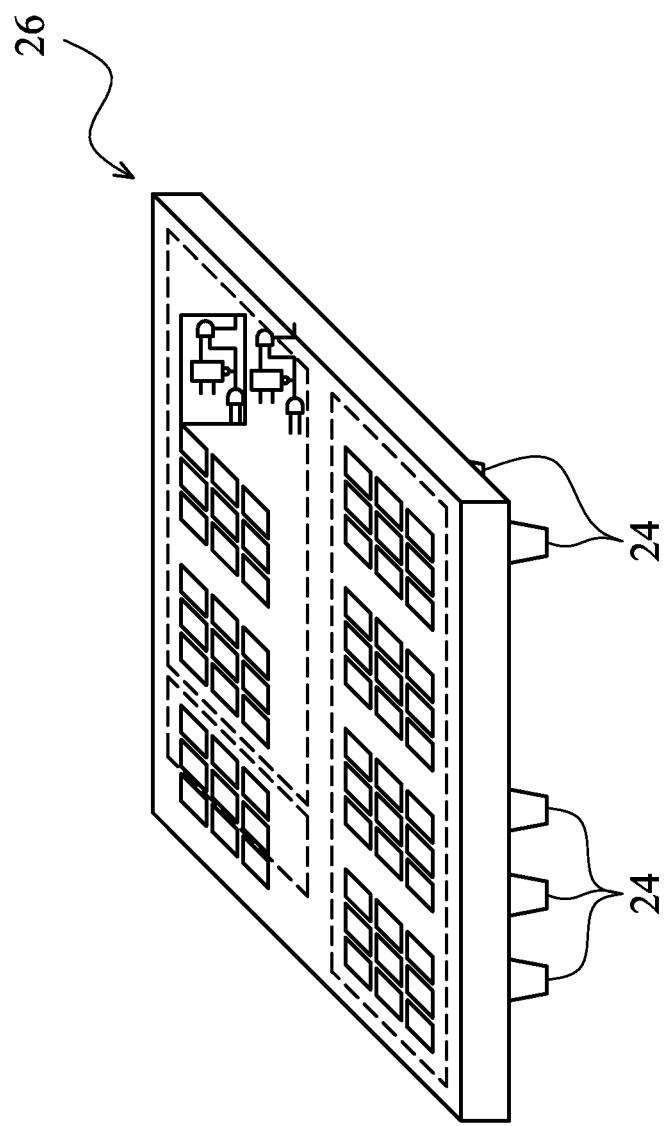

Semiconductor wafer 22 in silicon-based probe card 20 may include a plurality of chips 26. In some embodiments, the total number of chips 26 is equal to the total number of chips 102 in DUT 100, and the locations of chips 26 are also aligned to the locations of chips 102. In these embodiments, each of chips 26 is used for the probing of one of chips 102. Each of FIGS. 2 and 3 illustrates a magnified perspective view of chip 26, wherein the devices (such as transistors) in chips 26 are illustrated using rectangular patterns. In some embodiments, chips 26 comprise integrated circuit devices such as passive devices (resistors, capacitors, or the like) and/or active devices such as transistors. The integrated circuit devices in chips 26 may be used as test engines. Accordingly, throughout the description, chips 26 are also referred to as test engines 26. As illustrated in FIG. 2, chips 26 may be a passive test engine, which includes passive devices, and do not include active devices.

Alternatively, as shown in FIG. 3, chip 26 may be an active test engine, which includes active devices such as transistors, as symbolized by a circuit. The active devices in chips 26 may include field programmable gate array (FPGA) and/or built-in self test (BIST) circuits. Accordingly, active test engines 26 may receive control signals from a test equipment, perform probing on DUT 100, and feedback the probe results to the test equipment. Building probing ability in chips 26 may reduce the required number of probe pins and pogo pins 44 (not shown in FIG. 3, please refer to FIG. 5). Chips 26 may also include the function of fault locality detection for detecting defect locations, and/or a repairing function for repairing defective DUTs.

Figure 5:
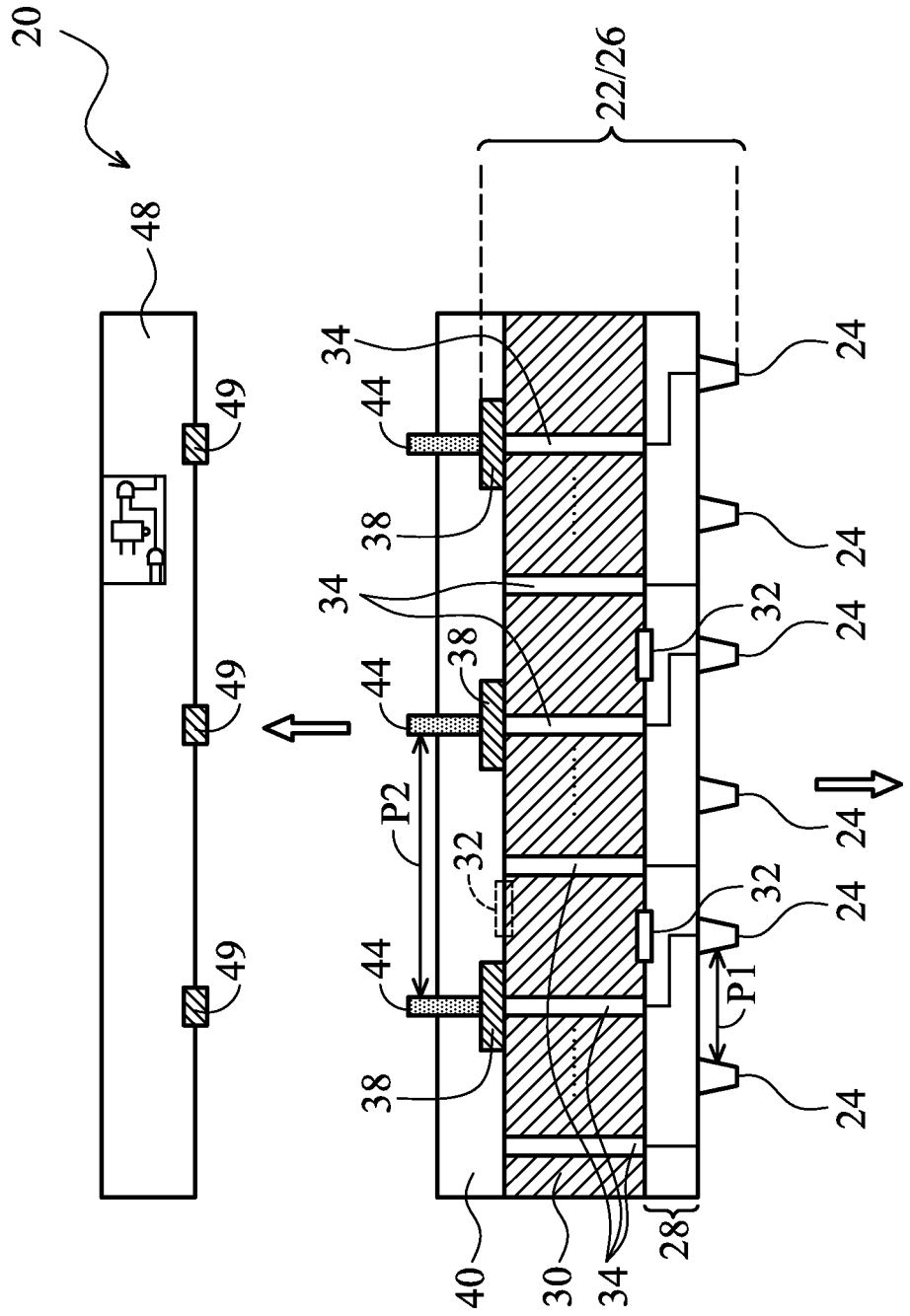
FIG. 5 illustrates the cross-sectional view of a portion of a silicon-based probe card, which includes test engines therein.

FIG. 5 illustrates a cross-sectional view of a portion of silicon-based probe card 20, which may be a wafer-level probe card in accordance with some embodiments. In an embodiment, silicon-based probe card 20 includes semiconductor wafer 22. Semiconductor wafer 22 further includes semiconductor substrate 30, which may be a silicon substrate, for example, although it may also be formed of other semiconductor materials. Interconnect structure 28, which may include metal lines and vias (not shown), are formed on a side of semiconductor substrate 30. Active devices 32 may be formed on a side of substrate 30. In an exemplary embodiment, active devices 32 are formed on the illustrate bottom side of substrate 30, and are electrically connected to probe contacts 24 and through-vias 34 (also sometimes referred to as through-silicon vias or through-substrate vias). Metal pads 38 are formed on the illustrated top side of substrate 30, and are electrically coupled to through-vias 34. In alternative embodiments, interconnect structure 28 and active devices 32 may be formed on the top side of substrate 30. Semiconductor wafer 22 may be formed using three-dimensional integrated circuit (3DIC) manufacturing processes. For example, active devices 32 are first formed on a side of substrate 30, followed by the formation of through-vias 34, which extend into substrate 30. Interconnect structure 28 is then formed. Probe contacts 24 are also formed. A backside grinding is then performed to expose through-vias 34, and metal pads 38 and the corresponding connections that connect through-vias 34 to pads 38, may then be formed.

Dielectric substrate 40 is joined to a side of substrate 30, with pogo pins 44 installed in dielectric substrate 40. Dielectric substrate 40 provides the insulation to electrical connections, and provides mechanical support to substrate 30. As a result, the warpage of test wafer 22 may be reduced. Pogo pins 44 may include adjustable and extensible pins that may be retracted slightly when pressed, which pins may also push back when no force is applied. Accordingly, the tips of pogo pins 44 may have a good co-planarity, and even if test wafer 22 and dielectric substrate 40 have a warpage, pogo pins 44 may still have good electrical contact with pads 49 in the overlying (printed circuit board (PCB) 48. In some embodiments, as shown in FIGS. 12 through 17, pogo pins 44 may also penetrate through socket base 62, which is locked and secured onto PCB 48. The tips of pogo pins 44 are put into contact with contact pads 49 in PCB 48. The back ends of pogo pins 44 may be landed on, and electrically connected to, metal pads 38. Accordingly, pogo pins 44 act as a reliable connection between PCB 48 and wafer 22.

Probe contacts 24 have minimum pitch P1, which may be the same as the minimum pitch P1 of DUT 100 (FIG. 1), and may be smaller than about 40 µm. Pogo pins 44 and metal pads 38 have minimum pitch P2, which is greater than P1. Accordingly, silicon-based probe card 20 has a fan-out structure for converting the pitch P1 of probe contacts 24 to the greater pitch P2 of pogo pins 44, and hence pogo pins 44 may be readily connected to PCB 48, which generally has a large pitch. In an embodiment, from probe contacts 24 to metal pads 38, there is a one-to-one correspondence, wherein each of probe contacts 24 is connected to one of metal pads 38, and vice versa. In other embodiments, from probe contacts 24 to metal pads 38, there is a one-to-multiple correspondence, wherein multiple probe contacts 24 are connected to one metal pad 38, or alternatively, each of probe contacts 24 is connected to multiple metal pads 38. With the connections between wafer 22 and PCB 48, the BIST/FPGA circuits in active devices 32 (which is comprised in active engine 26) are electrically coupled to probe contacts 24, and hence active engine 26 may probe the circuits in DUT 100 (FIG. 1) to generate probe results, and send the probe results to pogo pins 44, and further to PCB 48.

In some embodiments, silicon-based probe card 20 is at wafer scale, and an entire test wafer 22 is built in silicon-based probe card 20. In alternative embodiments, silicon-based probe card 20 is at the chip scale, and the illustrated discrete chip 26 (and corresponding substrate 30) in FIG. 5 is a portion of test wafer 22 that has already been sawed from test wafer 22 (FIG. 1). The sizes of dielectric substrate 40 and PCB 48 are accordingly at wafer-scale or chip-scale, depending on the size of substrate 30.

Figure 6:
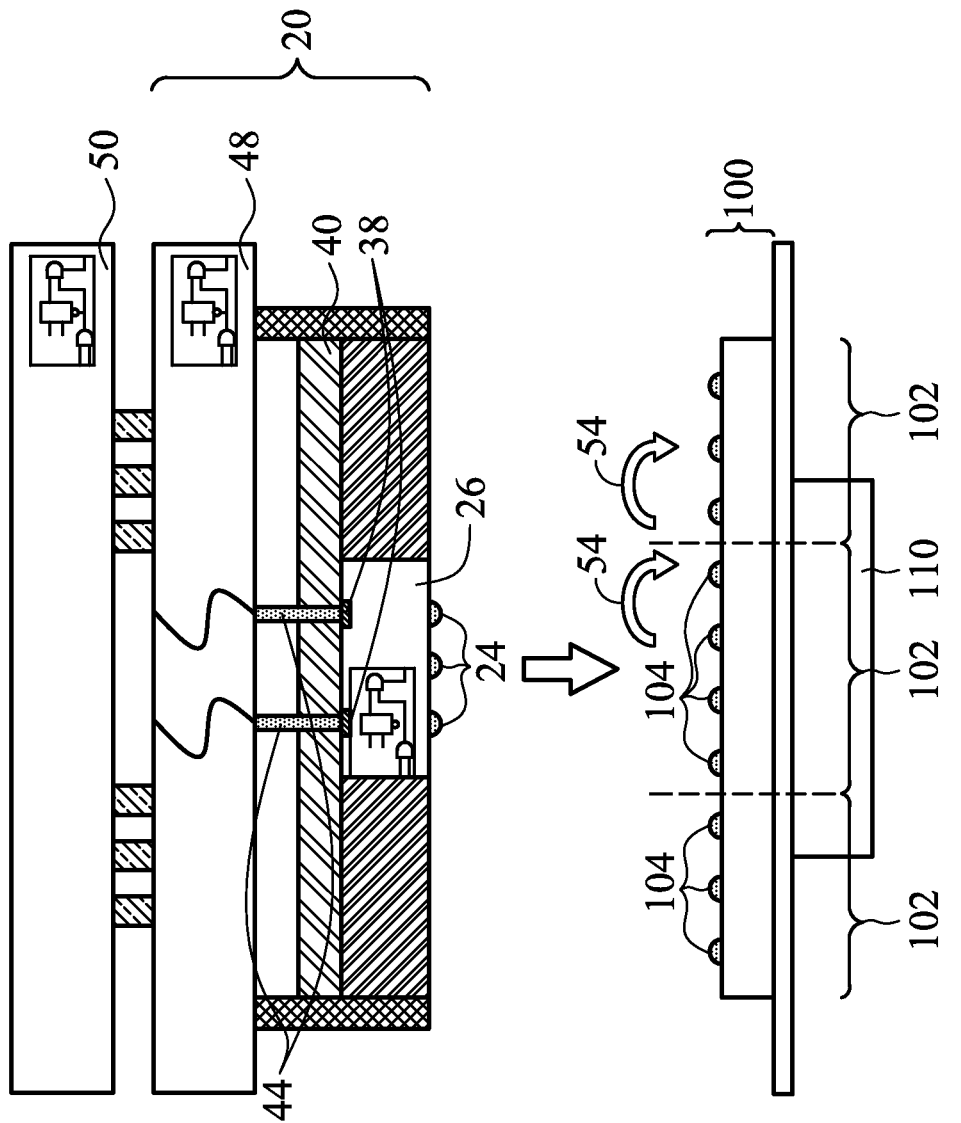
FIGS. 6 through 17 illustrate the probing of DUTs in accordance with various embodiments, wherein various embodiments of the silicon-based probe card are illustrated.

FIG. 6 illustrates the cross-sectional view of a chip-scale silicon-based probe card 20, and the connection scheme of silicon-based probe card 20 to test head and channel board 50, which belongs to a test equipment. Discrete chip 26 is bonded with dielectric substrate 40, which also has a chip size. Dielectric 40 and discrete chip 26 may also be secured to PCB 48, which may also have integrated circuit devices such as active circuits therein. In some embodiments, chip 26 and dielectric substrate 40 may be attached to PCB 48, wherein pogo pins 44 provide the electrical connection from chip 26 to PCB 48. PCB 48 also provides electrical connections from pogo pins 44 to test head and channel board 50.

During the probing of DUT 100, DUT 100 is placed on prober chuck 110. Since silicon-based probe card 20 is at the chip scale, in each of the probing, one of dies 102 is probed. After the probing of one of chips 102, silicon-based probe card 20 is moved to contact and probe another chip 102, as shown by arrows 54.

Figure 7:
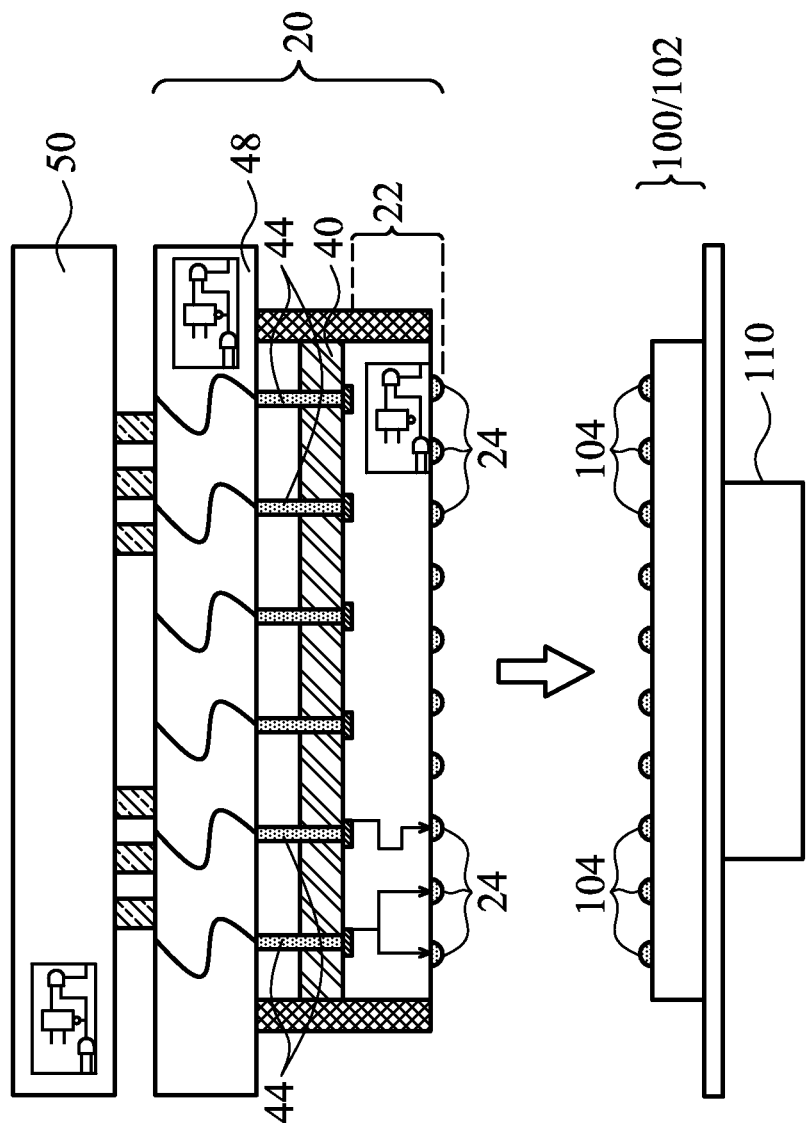

FIG. 7 illustrates the cross-sectional view of a wafer-scale silicon-based probe card 20, and the connection scheme of silicon-based probe card 20 to test head and channel board 50. Whole wafer 22, which includes a plurality of chips 26 therein, is bonded with dielectric substrate 40, which has a wafer size, and is further secured on PCB 48. During the probing of DUT 100, probe contacts 24 on test wafer 22 are put into contact with connectors 104 of DUT 100. The probing may be performed at wafer scale, and an entire DUT 100 may be probed without the need to move silicon-based probe card 20.

Figure 8:
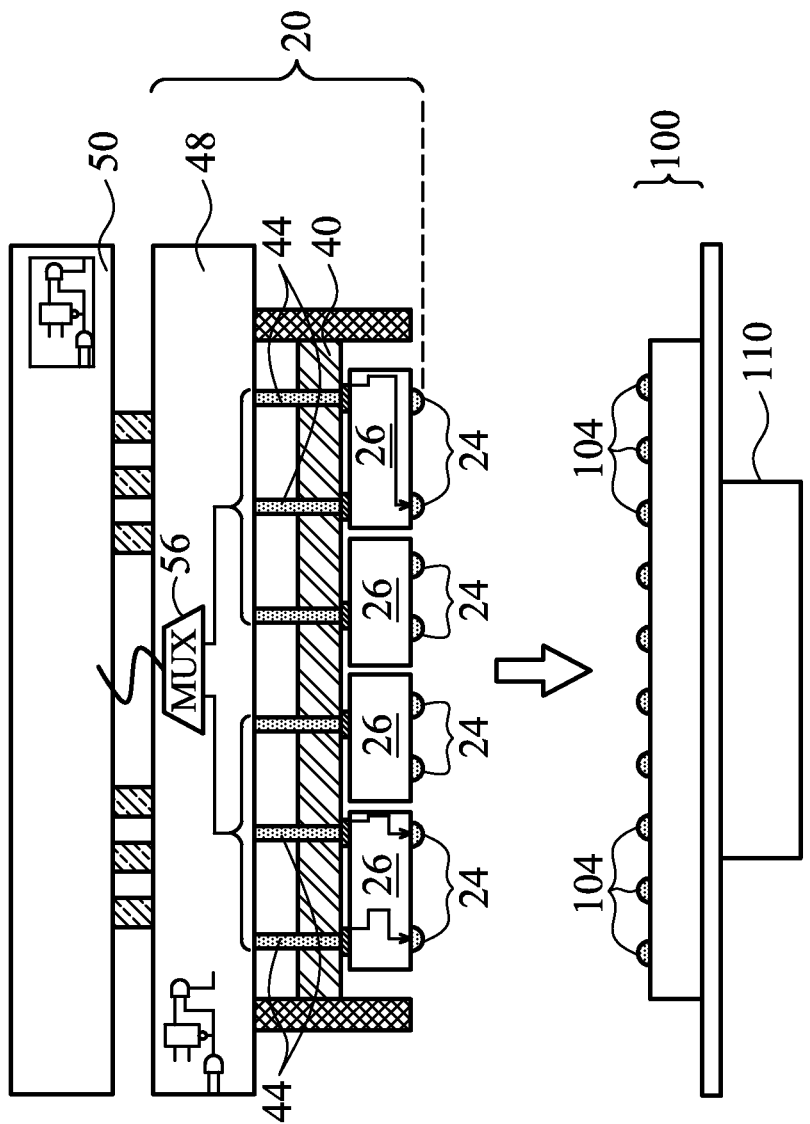

FIG. 8 illustrates the cross-sectional view of a multi-chip-scale silicon-based probe card 20, which includes a plurality of discrete chips 26 bonded to a same dielectric substrate 40. The number of chips 26 in silicon-based probe card 20 is less than, although it may be equal to, the total number of chips 102 in DUT 100. The use of multi-chip-scale silicon-based probe card 20 results in an increase in the efficiency of probing. The probing of the entire DUT 100, however, may still need a plurality of probes. The probing may be performed using multiplexer 56 to multiplex connections between different chips 26. This may be used for probing chips 26 that have a high count (for example, greater than a thousand or ten thousands) of probe contacts 24.

Figure 9:
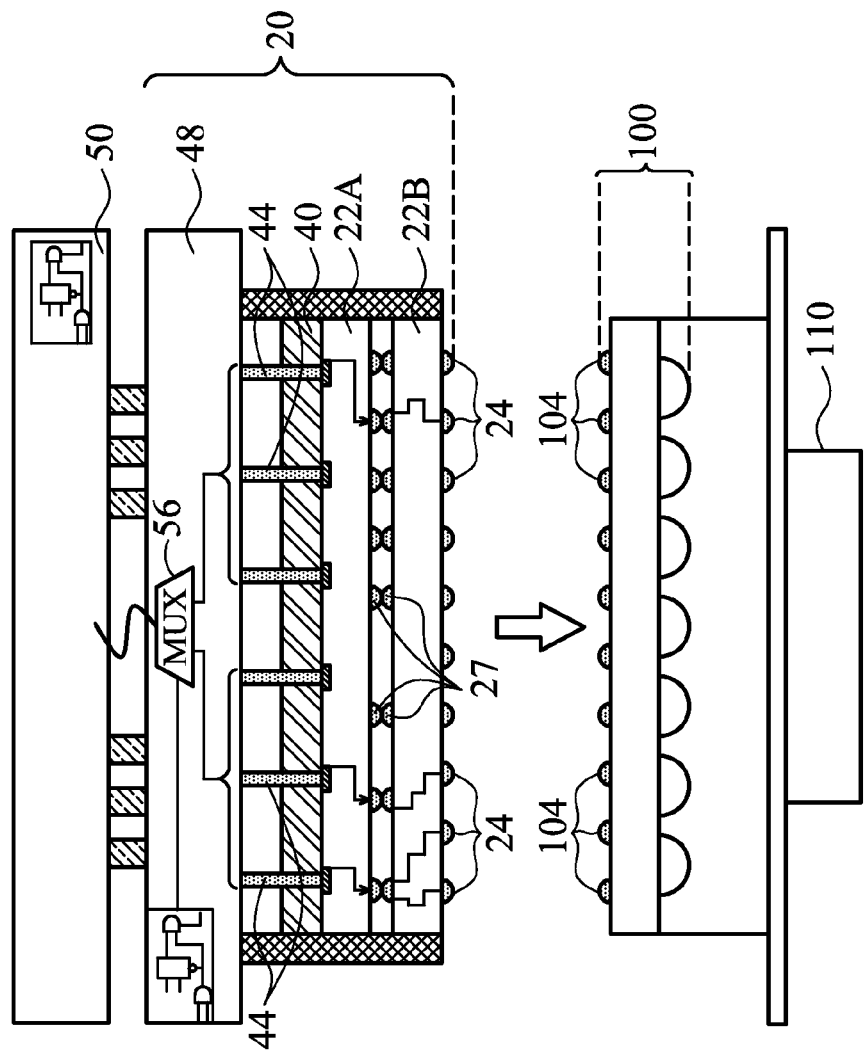

FIG. 9 illustrates a cross-sectional view of a wafer-scale silicon-based probe card 20, which includes stacked wafers. For example, wafers 22A and 22B are stacked and are joined to dielectric substrate 40. The stacking of wafers 22A and 22B may be performed through electrical connectors 27, wherein wafers 22A and 22B may be bonded to each other, or in physical contact with, but not bonded to, each other. Through this scheme, test wafers such as 22A and 22B may be reused for the probing of different products. For example, test wafer 22A may be used for the probing of DC connections, while test wafer 22A may be used for the probing of AC connections. When probing different products having different designs, a plurality of test wafers 22B may be customized for different products, while a same test wafer 22A may be used for the probing of different products. This may reduce the cost of designing and manufacturing of the test devices. Test wafers 22A and 22B in combination may also be referred to as a wafer-on-wafer (WoW) cube.

Figure 10:
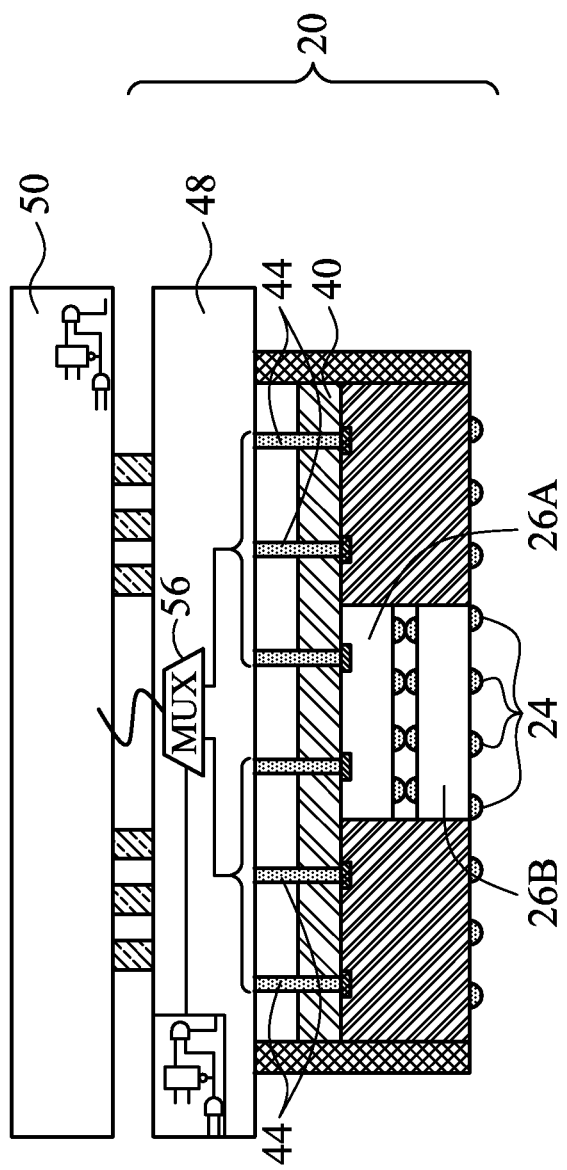

FIG. 10 illustrates silicon-based probe card 20 similar to what is shown in FIG. 9, except silicon-based probe card 20 is a chip-scale test unit that includes a plurality of chips 26, for example, chip 26A and chip 26B are stacked together. Chips 26A and 26B in combination may also be referred to as a chip-on-chip (CoC) cube.

Figure 11:
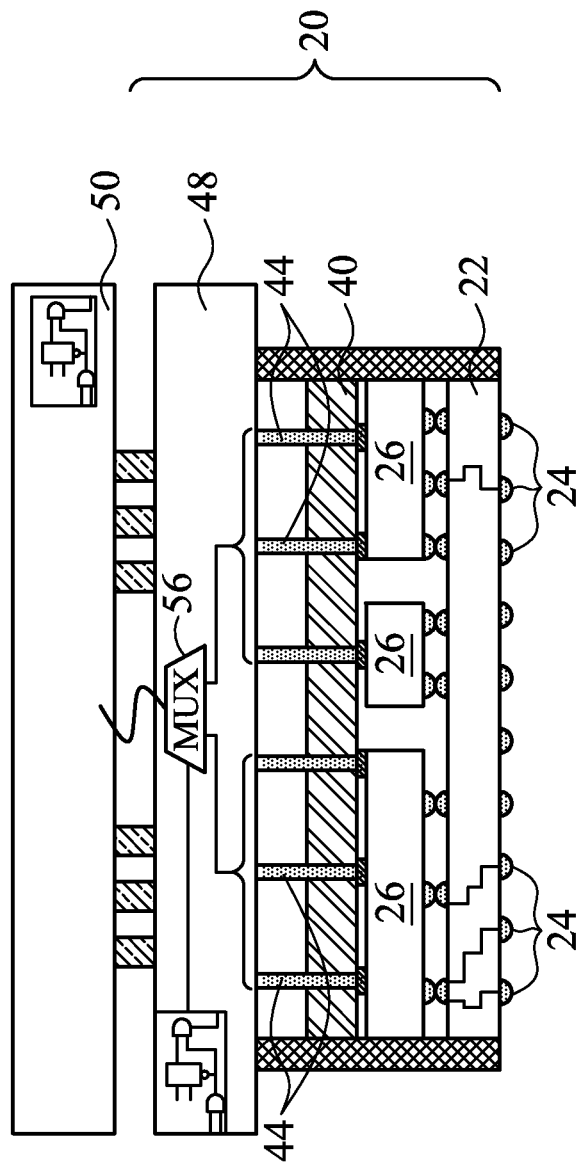

FIG. 11 illustrates an embodiment similar to what are shown in FIGS. 9 and 10, except silicon-based probe card 20 includes a chip-on-wafer stack, wherein a plurality of chips 26 is in contact with or bond to a same test wafer 22. Chips 26 and test wafer 22 in combination may also be referred to as a chip-on-wafer (CoW) cube. It is realized that the embodiments shown in FIGS. 9 through 11 are exemplary combinations, while there are more cubes may be formed using different schemes, such as wafer-on-chip scheme, which schemes are also in the scope of the present disclosure. In addition, there may be more than two levels of chips/wafer stacked to form a cube, wherein each of the levels may comprise one or a plurality of chips or a wafer. The cubes accordingly may include, and not limited to, chip-on-chip-on-chip (CoCoC), chip-on-substrate (CoS), chip-on-wafer-on-substrate (CoWoS), wafer-on-wafer-on-substrate (WoWoS), and the like. The chips, wafers, and systems in the same cube may be put to contact with each other without being bonded, or alternatively, bonded together.

FIGS. 12 through 17 illustrate the cross-sectional views of probing processes and the respective apparatus in accordance with some embodiments. It is noted that silicon-based probe cards 20 as shown in FIGS. 12 through 17 may be essentially the same as probe cards 20 in FIGS. 1 through 11. Further, silicon-based probe cards 20 are illustrated as flipped upside-down compared to silicon-based probe cards 20 in FIGS. 6 through 11. Please note that although FIGS. 12 through 17 illustrate that chips 26/wafers 22 are connected to pogo pins 44 through connectors with semi-rounded shapes, the connectors represented by the semi-rounded shapes may be pads 38 as in FIG. 5, or alternatively, solder balls, metal bumps, copper pillars, UBMs, or the like.

In each of FIGS. 12 through 17, test head and channel board 50 is provided, and is coupled to automatic test equipment 60, which is configured to provide test signals to silicon-based probe card 20. Alternatively, test equipment 60 provides control signals to drive test engines 26, so that test engines 26 conduct the probing of DUTs 100. Test head and channel board 50 also receives signals and probe results from the corresponding probe cards 20. PCB 48 is electrically coupled to test head and channel board 50. The tips of pogo pins 44 may be in contact with conductive pads 49 on the surface of PCB 48. Socket base 62 may optionally be placed over and electrically coupled to PCB 48. Socket base 62 may also be secured onto PCB 48 to form an integrated part. Dielectric substrate 40 and chips 26/wafers 22 may be attached to socket base 62. The details of silicon-based probe cards 20 and DUTs 100 may be found by referring to the embodiments shown in FIGS. 1 through 11.

In FIGS. 12 through 17, during the probing, DUTs 100 are disposed with connectors 104 facing down. DUT 100 is held by vacuum head 64, which lowers DUTs 100 down, until connectors 104 are in contact with probe contacts 24 of silicon-based probe cards 20. In some embodiments wherein DUTs 100 are thin, carriers 63 may be attached on the backside of DUTs 100 to mechanically support DUTs 100. The lowering of DUTs 100 is guided by guide 66, which limit the horizontal movement of DUTs 100 to ensure the accurate alignment between connectors 104 and probe contacts 24. The probing may then be initiated by automatic test equipment 60. After the probing is finished, vacuum head(s) 66 (which may also be pressure heads) lift DUTs 100 up.

Figure 12:
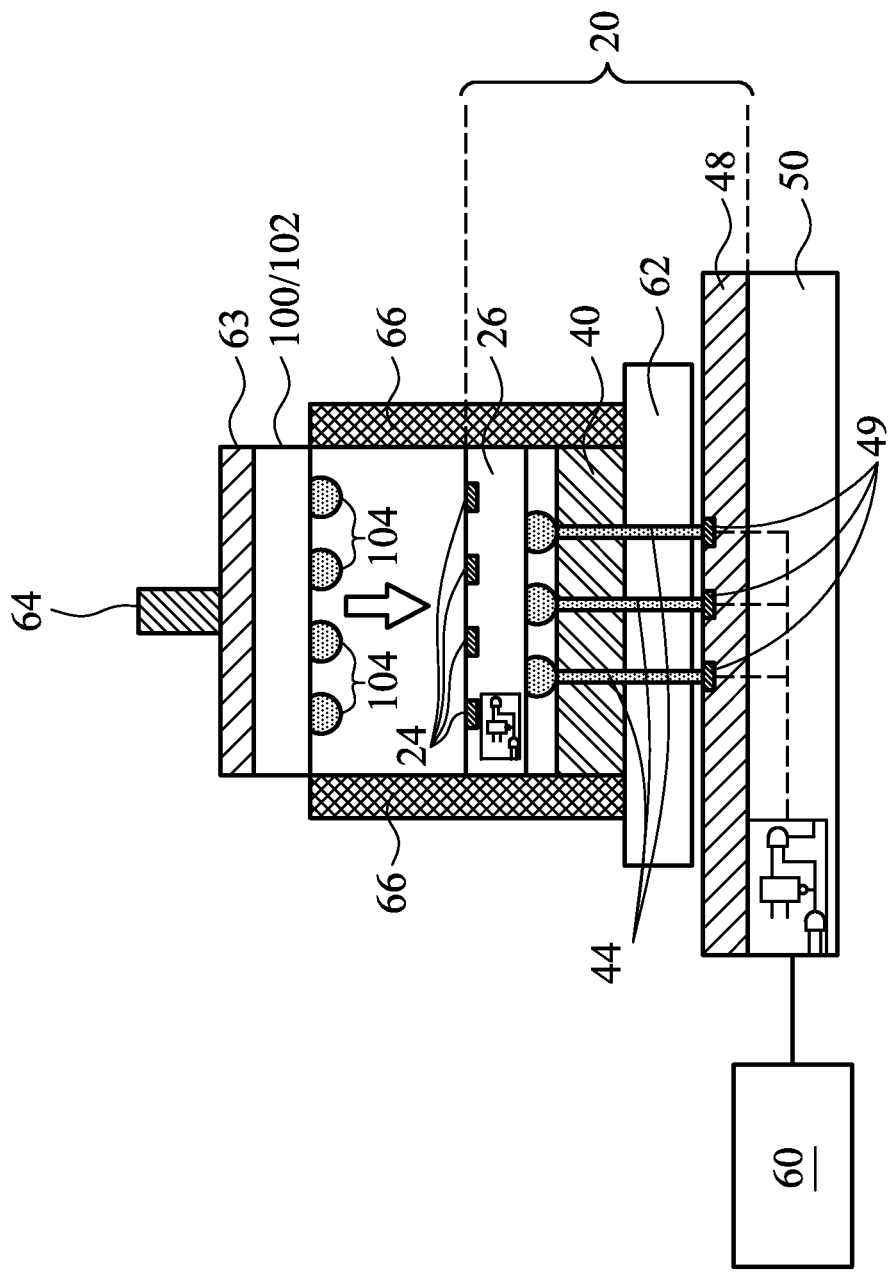
Figure 13:
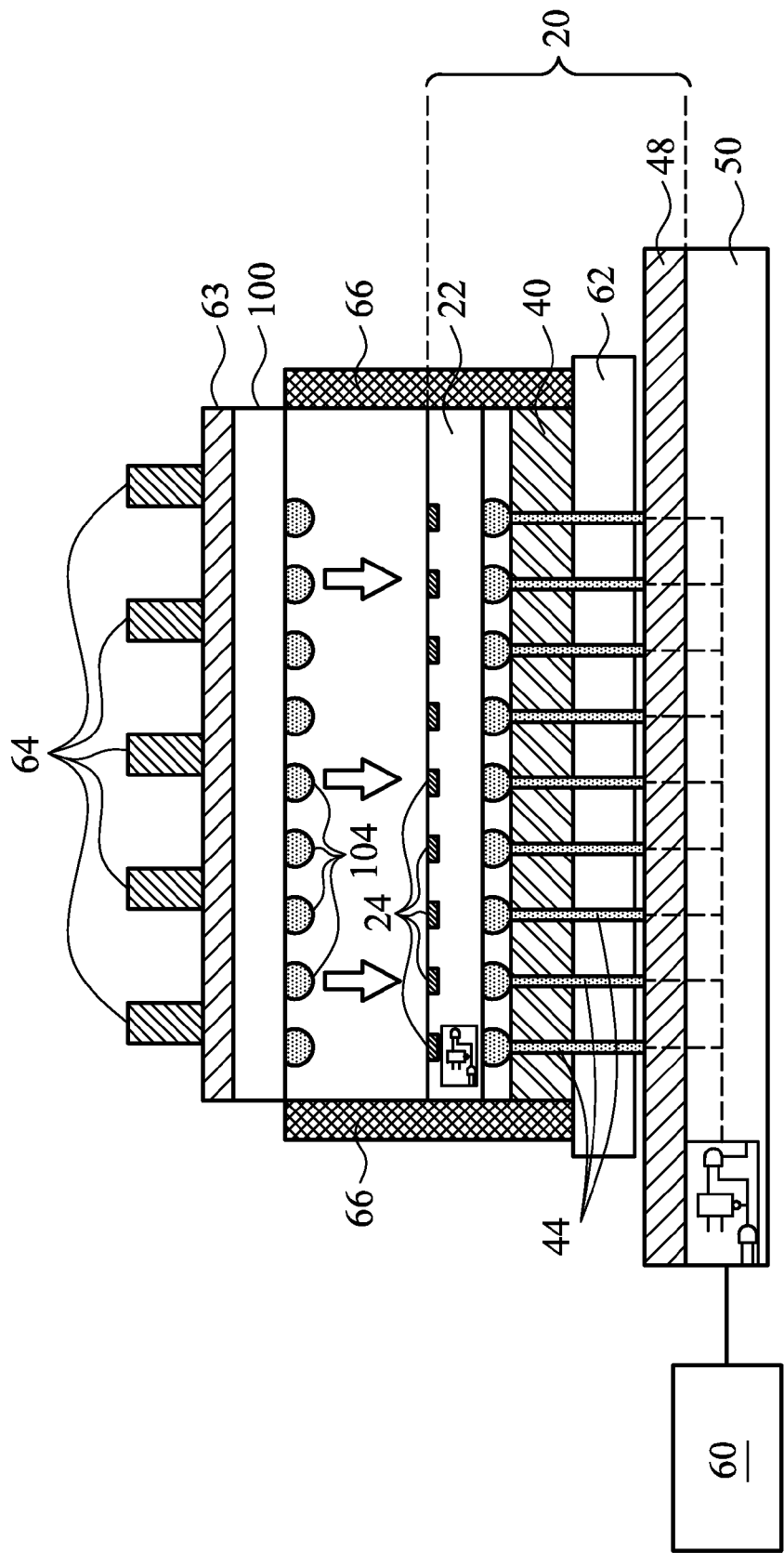
Figure 14:
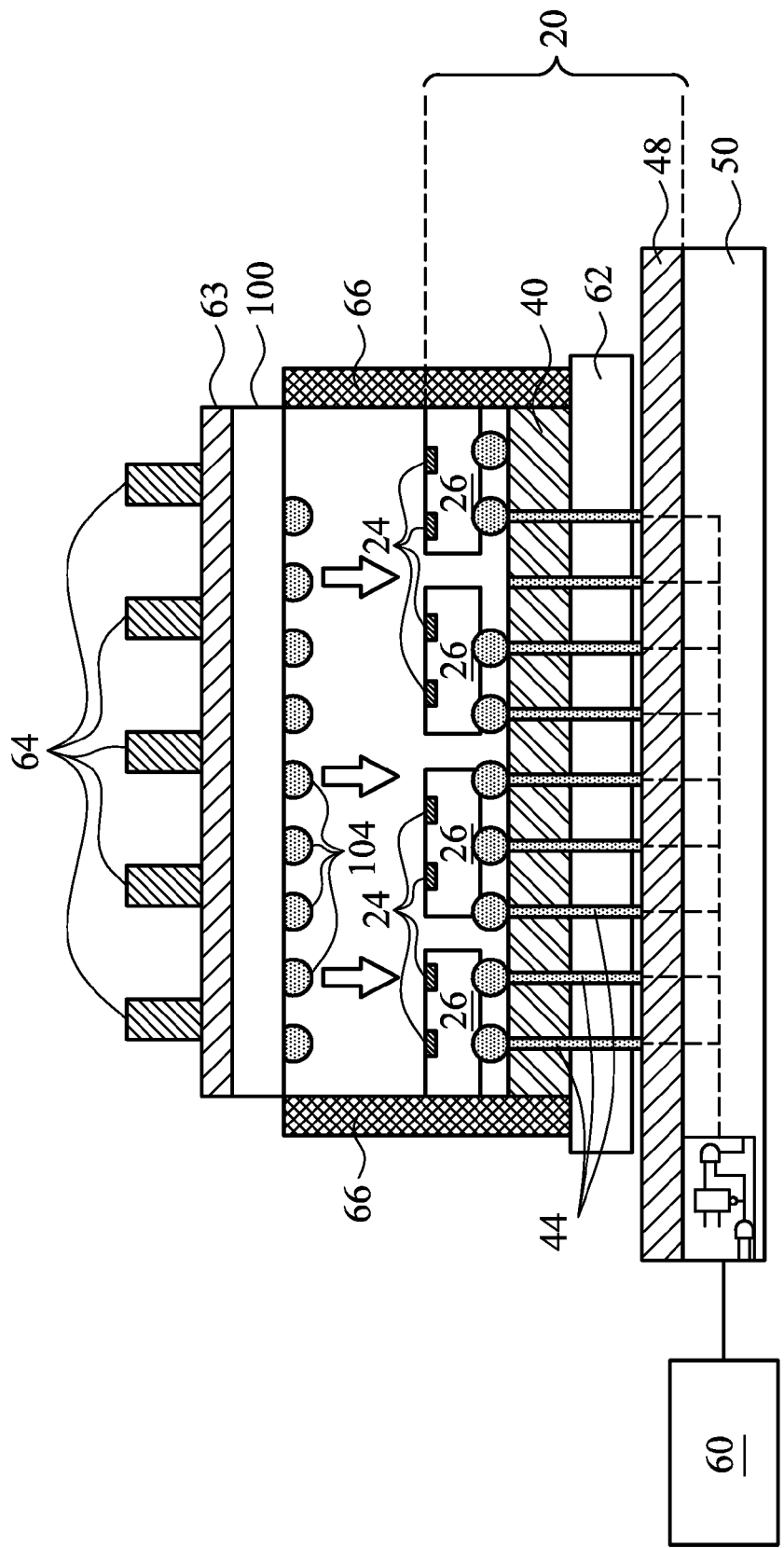
Figure 15:
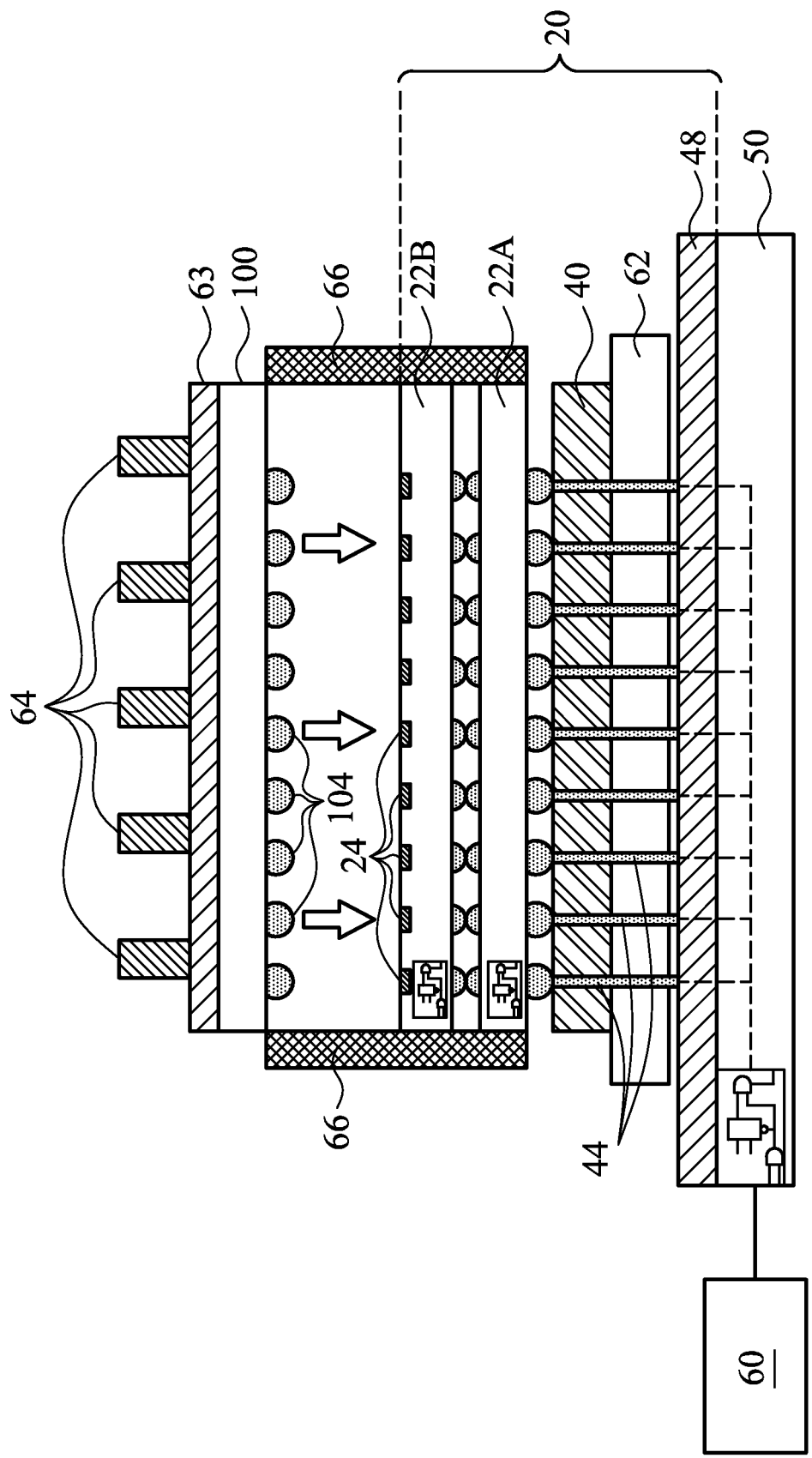
Figure 16:
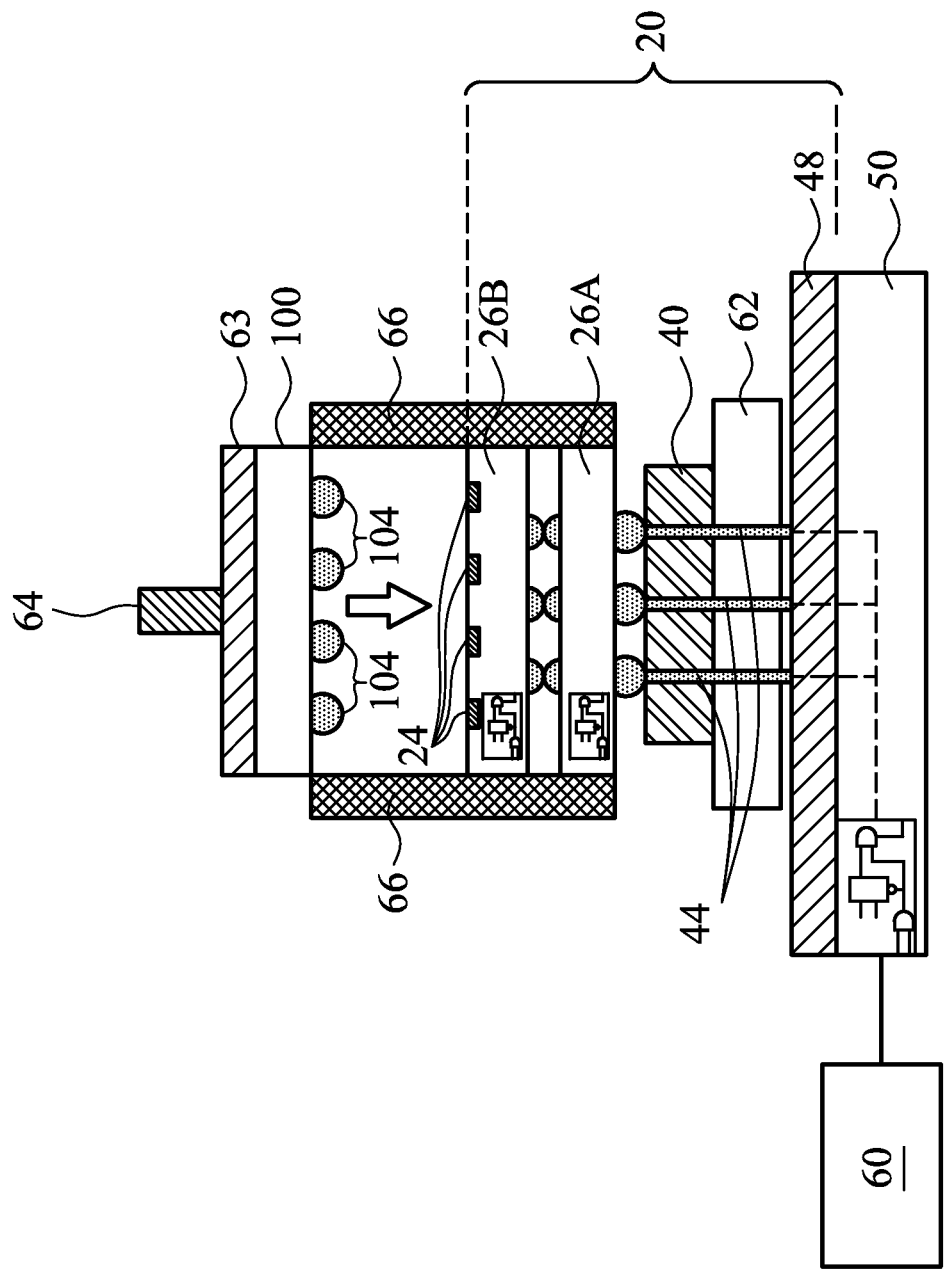
Figure 17:
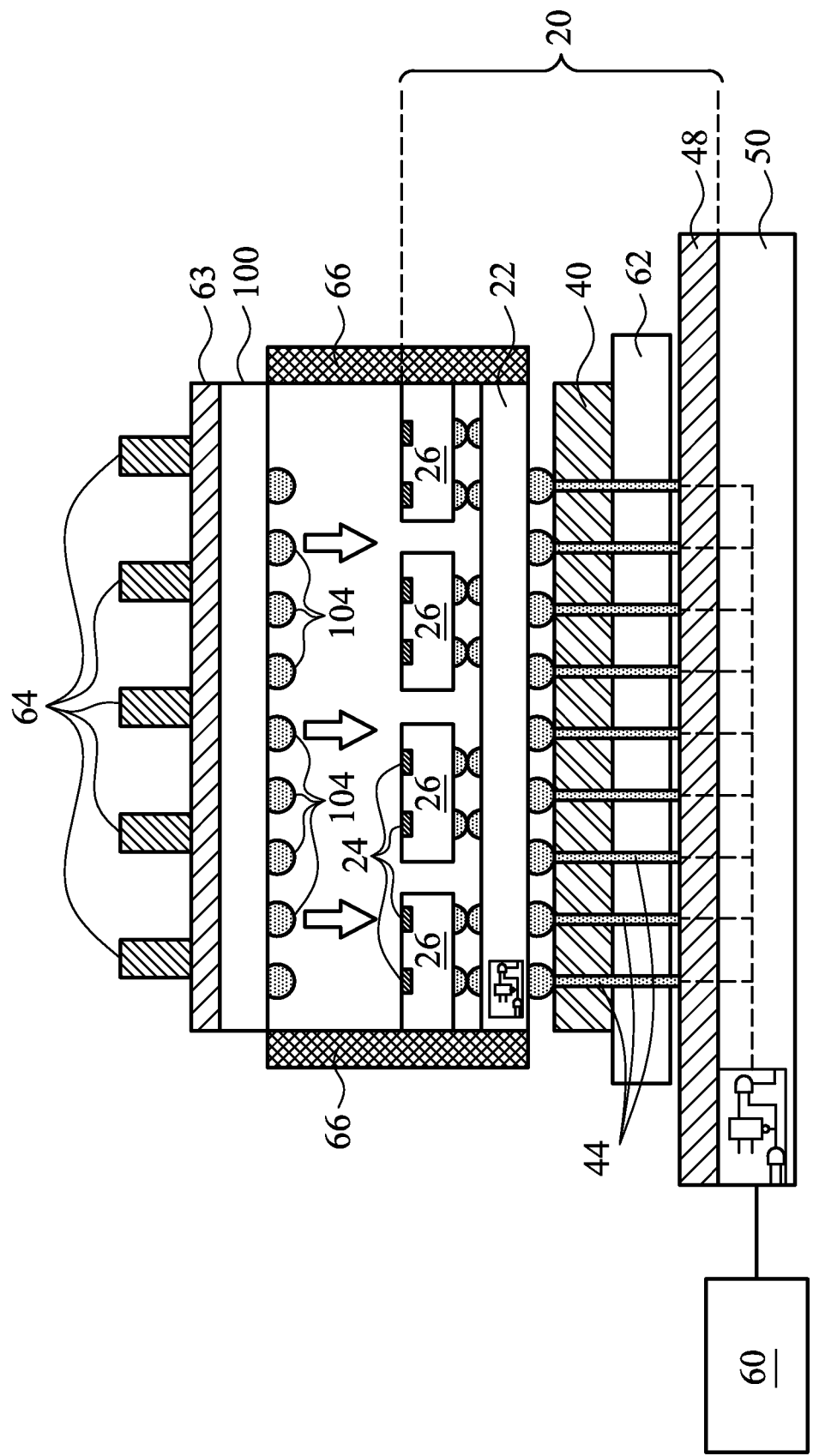

FIG. 12 illustrates the probing of DUT 100, which is a single-chip DUT comprising chip 102. Silicon-based probe card 20 is also a single-chip probe card that includes a single chip 26. FIG. 13 illustrates the probing of DUT 100, which is a wafer-scale DUT. Silicon-based probe card 20 is also a wafer-scale probe card that includes whole wafer 22. FIG. 14 illustrates the multi-chip-scale probing of DUT 100, which may be a wafer-scale DUT. Silicon-based probe card 20 includes a plurality of chips 26. This scheme may be used for testing, for example, DUTs that include more than one type of chips that have different designs. FIG. 15 illustrates the wafer-scale probing of DUT 100, which is a wafer-scale DUT. Silicon-based probe card 20 includes stacked wafers 22A and 22B, which are essentially the same as in FIG. 9. FIG. 16 illustrates the chip-scale probing of DUT 100, which is a chip-scale DUT. Silicon-based probe card 20 includes stacked chips 26A and 26B, which are essentially the same as in FIG. 10. FIG. 17 illustrates the wafer-scale probing of DUT 100, which is a wafer-scale DUT. Silicon-based probe card 20 includes chips 26 stacked on wafer 22. This embodiment may be essentially the same as in FIG. 11.

By using the embodiments, the full-wafer-scale probing is made possible, so that the throughput of the probing is improved, and the likelihood of damaging the DUTs is reduced. The probing may be performed on micro-bumps having very small pitches, for example, with pitches smaller than about 40 µm. Further, repair engines may be incorporated for the purpose of repairing the DUTs.

In accordance with embodiments, a device includes a probe card, which further includes a chip. The chip includes a semiconductor substrate, a test engine disposed in the chip, wherein the test engine comprises a device formed on the semiconductor substrate, wherein the device is selected from the group consisting essentially of a passive device, an active device, and combinations thereof. A plurality of probe contacts is formed on a surface of the chip and electrically coupled to the test engine.

In accordance with other embodiments, a probe card includes a chip, which further includes a semiconductor substrate, and a test engine disposed in the chip, wherein the test engine comprises a device selected from a passive device and an active device. A plurality of probe contacts is formed on a surface of the chip and electrically coupled to the test engine. A plurality of through-vias penetrates through the semiconductor substrate. A plurality of pogo pins includes back ends electrically coupled to the plurality of through-vias.

In accordance with yet other embodiments, a method includes placing probe contacts of a probe card in contact with electrical connectors of a device-under-test (DUT), wherein the probe contacts are located at a surface of a chip. The chip includes a semiconductor substrate, and a test engine disposed in the chip, wherein the test engine includes a device selected from a passive device, an active device, and combinations thereof. The chip further includes a plurality of through-vias penetrating through the semiconductor substrate and electrically coupled to the probe contacts. The method further includes performing a probing on the DUT by sending signals to the test engine.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a probe card comprising:
      a chip comprising:
         a semiconductor substrate;
         a test engine disposed in the chip, wherein the test engine comprises a device formed on the semiconductor substrate, wherein the device is selected from the group consisting essentially of a passive device, an active device, and combinations thereof; and
         a plurality of probe contacts formed on a surface of the chip and electrically connected to the test engine; and
      an additional chip stacked on the chip, wherein electrical connectors of the additional chip are electrically connected to electrical connectors of the chip.

2. The device of claim 1 further comprising a test equipment configured to probe integrated circuits, wherein the test equipment is electrically connected to the test engine, and is configured to drive the test engine to probe a device-under-test (DUT) electrically connected to the plurality of probe contacts of the chip.

3. The device of claim 1, wherein the probe card comprises a test wafer, with the chip being one of a plurality of chips of the wafer.

4. The device of claim 1, wherein the probe card comprises a plurality of discrete chips, with each of the chips comprising an additional test engine.

5. The device of claim 1, wherein the chip comprises:
   a plurality of through-vias penetrating through the semiconductor substrate;
   a plurality of pads, wherein the plurality of pads and the plurality of probe contacts are on opposite sides of the semiconductor substrate; and
   a plurality of pogo pins, wherein back ends of the plurality of pogo pins are electrically connected to the plurality of pads.

6. The device of claim 5 further comprising:
   a device-under-test (DUT) electrically connected to the plurality of probe contacts of the chip; and
   a guide for guiding the DUT to align to the probe card, wherein the guide is assembled to the probe card.

7. The device of claim 5, wherein the plurality of pads have a first minimum pitch equal to or greater than a second minimum pitch of the plurality of probe contacts.

8. The device of claim 1, wherein one of the chip and the additional chip is a part of a whole wafer, and another one of the chip and the additional chip is a discrete chip.

9. The device of claim 1, wherein the chip is a part of a whole wafer, and the additional chip is a discrete chip.

10. The device of claim 1, wherein the chip is a part of a first whole wafer, and the additional chip is a part of a second whole wafer, with the first whole wafer bonded to the second whole wafer.

11. A device comprising:
    a probe card comprising:
       a chip comprising:
          a semiconductor substrate;
          a test engine disposed in the chip, wherein the test engine comprises a device selected from the group consisting essentially of a passive device, an active device, and combinations thereof;
          a plurality of probe contacts formed on a surface of the chip and electrically connected to the test engine;
          a plurality of through-vias penetrating through the semiconductor substrate; and
          a plurality of pogo pins, wherein back ends of the plurality of pogo pins are electrically connected to the plurality of through-vias.

12. The device of claim 11 further comprising a dielectric substrate joined to the chip, wherein the plurality of pogo pins penetrates through the dielectric substrate, and wherein pin tips and back ends of the plurality of pogo pins are on opposite sides of the dielectric substrate.

13. The device of claim 11 further comprising:
    a printed circuit board; and
    a test equipment configured to probe integrated circuits, wherein the test equipment is electrically connected to the test engine through the printed circuit board and the plurality of pogo pins, and is configured to drive a test of a device-under-test (DUT) electrically connected to the plurality of probe contacts of the chip.

14. The device of claim 11, wherein the probe card comprises a whole wafer, with the chip being one of a plurality of chips of the wafer.

15. The device of claim 11, wherein the probe card comprises a plurality of discrete chips, with each of the chips comprising one of a plurality of test engines.

16. The device of claim 11, wherein the plurality of pogo pins has a first minimum pitch not smaller than a second minimum pitch of the plurality of probe contacts.

17. The device of claim 11, wherein the test engine comprises an active test engine, and wherein the active test engine is configured to receive control signals through the plurality of pogo pins, and perform a probing of a DUT that has electrical connectors in contact with the plurality of probe contacts.

18. A device comprising:
    a probe card comprising a wafer, wherein the wafer comprises a plurality of chips identical to each other, and each of the plurality of chips comprises:
       a semiconductor substrate;
       a plurality of through-vias penetrating through the semiconductor substrate;
       a test engine disposed at a surface of the semiconductor substrate; and
       a plurality of probe contacts formed on a first side of the each of the plurality of chips, wherein the plurality of probe contacts is electrically connected to the test engine and the plurality of through-vias.

19. The device of claim 18, wherein the each of the plurality of chips further comprises a plurality of metal pads on a second side of the semiconductor substrate, wherein the plurality of metal pads is electrically coupled to the plurality of probe contacts through the plurality of through-vias.

20. The device of claim 19 further comprising a plurality of pogo pins on the second side of the semiconductor substrate, wherein the plurality of pogo pins is in physical contact with the plurality of metal pads.

21. The device of claim 18, wherein the wafer has a round shape.

22. The device of claim 4, wherein each of the plurality of discrete chips is physically separated from other ones of the plurality of discrete chips.

* * * * *